(12) United States Patent
Sharan et al.

(10) Patent No.: US 6,227,141 B1
(45) Date of Patent: *May 8, 2001

(54) RF POWERED PLASMA ENHANCED CHEMICAL VAPOR DEPOSITION REACTOR AND METHODS

(75) Inventors: Sujit Sharan; Gurtej S. Sandhu, both of Boise, ID (US); Paul Smith, San Jose, CA (US)

(73) Assignees: Micron Technology, Inc., Boise, ID (US); Applied Materials, Inc., Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/597,659

(22) Filed: Jun. 19, 2000

Related U.S. Application Data

(63) Continuation of application No. 09/026,566, filed on Feb. 19, 1998, now Pat. No. 6,112,697.

(51) Int. Cl.$^7$ ................ C23C 16/00; H05H 1/00
(52) U.S. Cl. ................ 118/723 E; 118/723 AN; 156/345
(58) Field of Search ............ 118/723 E, 724, 118/723 R, 723 AN; 156/345; 315/111.21

(56) References Cited

U.S. PATENT DOCUMENTS

| | | |
|---|---|---|
| 4,585,516 | 4/1986 | Corn et al. . |
| 5,039,388 | 8/1991 | Miyashita et al. . |
| 5,052,239 | 10/1991 | Vakerlis et al. . |
| 5,102,523 | 4/1992 | Beisswenger et al. . |
| 5,147,493 | 9/1992 | Nishimura et al. . |
| 5,230,931 | 7/1993 | Yamazaki et al. . |
| 5,260,236 | 11/1993 | Petro et al. . |
| 5,261,962 | 11/1993 | Hamamoto et al. . |
| 5,272,417 | 12/1993 | Ohmi . |
| 5,433,786 | 7/1995 | Hu et al. . |
| 5,439,524 | 8/1995 | Cain et al. . |
| 5,468,296 | 11/1995 | Patrick et al. . |
| 5,567,267 | 10/1996 | Kazama et al. . |

(List continued on next page.)

FOREIGN PATENT DOCUMENTS

| | | |
|---|---|---|
| 0 552 491 A1 | 7/1993 | (EP) . |
| 0 641 150 A1 | 3/1995 | (EP) . |
| 0 678 903 A1 | 10/1995 | (EP) . |
| 0 686 708 A1 | 12/1995 | (EP) . |
| 742 577 A2 | 11/1996 | (EP) . |
| 776 991 A1 | 6/1997 | (EP) . |
| 831 679 A1 | 3/1998 | (EP) . |
| 2 663 806 | 12/1991 | (FR) . |
| 5-175163 | 7/1993 | (JP) . |
| WO 89/02695 | 3/1989 | (WO) . |
| WO 95/32315 | 11/1995 | (WO) . |
| WO 98/32154 | 11/1999 | (WO) . |

*Primary Examiner*—Gregory Mills
*Assistant Examiner*—P. Hassanzadeh
(74) *Attorney, Agent, or Firm*—Wells, St. John, Roberts, Gregory & Matkin P.S.

(57) ABSTRACT

Plasma enhanced chemical vapor deposition (PECVD) reactors and methods of effecting the same are described. In a preferred implementation, a PECVD reactor includes a processing chamber having a first electrode therewithin. A second electrode is disposed within the chamber and is configured for supporting at least one semiconductor workpiece for processing. A first RF power source delivers RF power of a first frequency to the first electrode. A second RF power source delivers RF power of a second frequency to the second electrode. Preferably the first and second frequencies are different from one another, and even more preferably, the first frequency is greater than the second frequency. The preferred reactor includes a thermocouple which provides temperature information relative to one of the electrodes. According to a preferred implementation, the power loop developed by the first RF power source is grounded interiorly of the chamber in a manner which reduces if not eliminates interference with other reactor components including the thermocouple.

35 Claims, 3 Drawing Sheets

U.S. PATENT DOCUMENTS

| | | |
|---|---|---|
| 5,605,637 | 2/1997 | Shan et al. . |
| 5,607,542 | 3/1997 | Wu et al. . |
| 5,656,123 | 8/1997 | Salimian et al. . |
| 5,665,167 | 9/1997 | Deguchi et al. . |
| 5,716,534 | 2/1998 | Tsuchiya et al. . |
| 5,863,339 | 1/1999 | Usami . |
| 5,865,937 | 2/1999 | Shan et al. . |
| 5,900,103 | 5/1999 | Tomoyasu et al. . |
| 5,919,332 | 7/1999 | Koshiishi et al. . |
| 5,942,075 | 8/1999 | Nagahata et al. . |

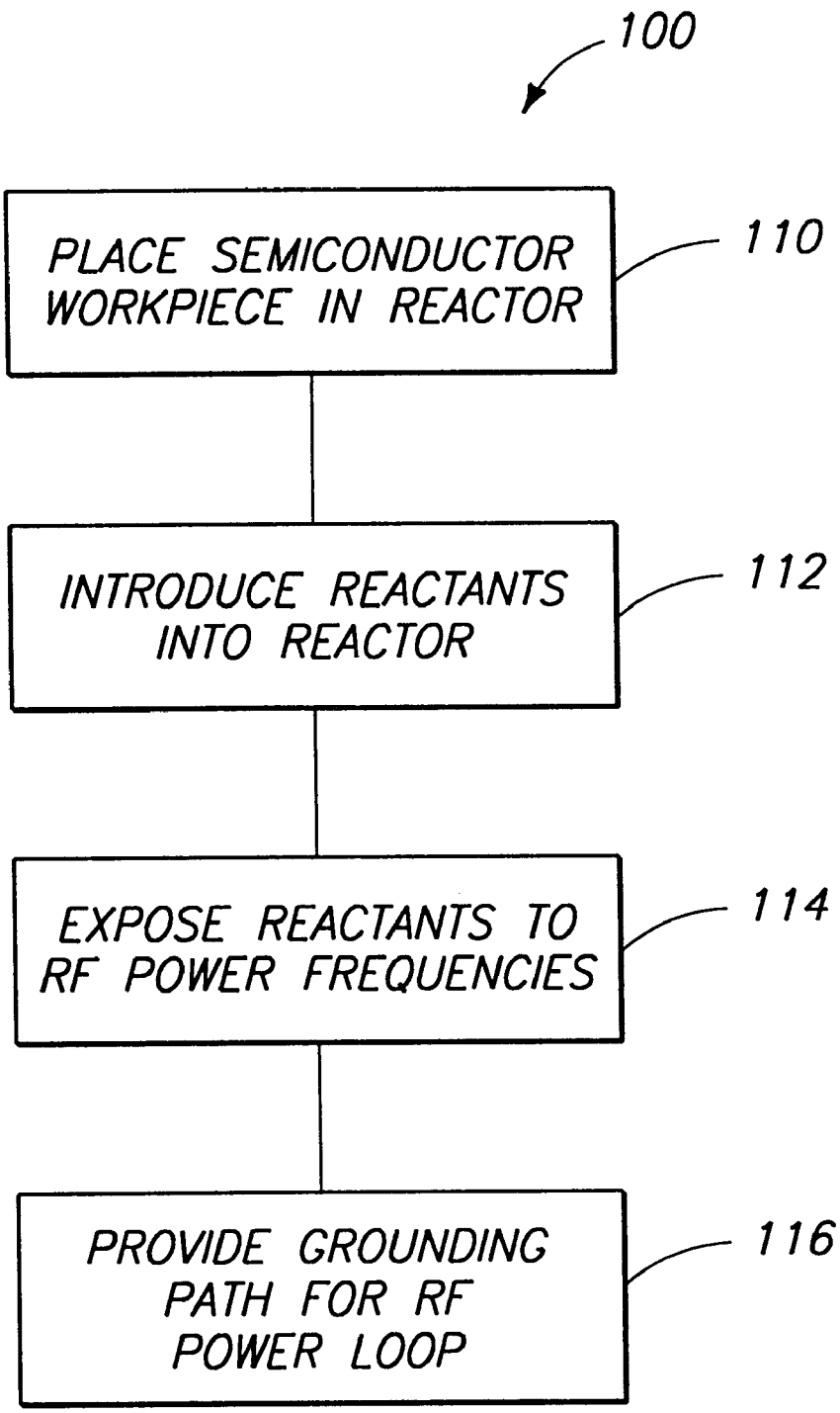

RF POWERED PLASMA ENHANCED CHEMICAL VAPOR DEPOSITION REACTOR AND METHODS

CROSS REFERENCE TO RELATED APPLICATION

This is a Continuation of U.S. patent application Ser. No. 09/026,566, filed Feb. 19, 1998, now U.S. Pat. No. 6,112,697 and titled "RF Powered Plasma Enhanced Chemical Vapor Deposition Reactor and Methods."

TECHNICAL FIELD

This invention relates to RF powered plasma enhanced chemical vapor deposition reactors and methods of effecting plasma enhanced chemical vapor deposition.

BACKGROUND OF THE INVENTION

Semiconductor processing often involves the deposition of films or layers over or on a semiconductor substrate surface which may or may not have other layers already formed thereon. One manner of effecting the deposition of such films or layers is through chemical vapor deposition (CVD). CVD involves a chemical reaction of vapor phase chemicals or reactants that contain the desired constituents to be deposited on the substrate or substrate surface. Reactant gases are introduced into a reaction chamber or reactor and are decomposed and reacted at a heated surface to form the desired film or layer.

There are three major CVD processes which exist and which may be utilized to form the desired films or layers. These are: atmospheric pressure CVD (APCVD), low pressure CVD (LPCVD), and plasma enhanced CVD (PECVD). The former two processes (APCVD and LPCVD) are characterized by their pressure regimes and typically use thermal energy as the energy input to effect desired chemical reactions. The latter process (PECVD) is characterized by its pressure regime and the method of energy input.

In PECVD systems, rather than relying on thermal energy to initiate and sustain chemical reactions, RF-induced glow discharge is used to transfer energy to the reactant gases. Such allows the substrate to remain at a lower temperature than the APCVD and LPCVD systems. Lower substrate temperatures are desirable in some instances because some substrates do not have the thermal stability to accept coating by the other methods. Other desirable characteristics include that deposition rates can be enhanced and films or layers with unique compositions and properties can be produced. Furthermore, PECVD processes and systems provide other advantages such as good adhesion, low pinhole density, good step coverage, adequate electrical properties, and compatibility with fine-line pattern transfer processes.

One problem, however, associated with deposition processing including PECVD processing stems from non-uniform film or layer coverage which can result especially in high aspect ratio topographies. For example, a problem known as "bread-loafing" or cusping can typically occur in deposition processing. Such normally involves undesirable non-uniform build-up of deposited material forming what appear as key hole spaces between features on a substrate. One prior art solution has been to conduct multiple depositions of very thin layers with intervening plasma etching treatments. The intervening plasma etching serves to remove or cut away the cusps to form a more uniformly applied layer. Thereafter, repeated depositions and etchings are conducted until the desired coverage is achieved. It is desirable to improve upon the quality of film or layer deposition in PECVD processes and reactors.

Another problem associated with PECVD reactors stems from the use of the high frequency RF power which is utilized to develop the desired plasma environment. Such high frequency RF power typically develops a high frequency power loop which tends to interfere in an undesirable way with the operation of other reactor components. For example, often times a thermocouple link is established with one or more of the electrodes to monitor the subject electrode temperature during processing operations. The high frequency loop can and often does render the readings taken by the thermocouple link inaccurate. Thus, it is desirable to improve upon the manner in which high frequency RF power is utilized in PECVD reactors.

This invention grew out of concerns associated with improving PECVD processing systems and methods. This invention also grew out of concerns associated with improving the advantages and characteristics associated with PECVD systems, including those advantages and characteristics mentioned above.

SUMMARY OF THE INVENTION

Plasma enhanced chemical vapor deposition (PECVD) reactors and methods of effecting the same are described. In a preferred implementation, a PECVD reactor includes a processing chamber having a first electrode therewithin. A second electrode is disposed within the chamber and is configured for supporting at least one semiconductor workpiece for processing. A first RF power source delivers RF power of a first frequency to the first electrode. A second RF power source delivers RF power of a second frequency to the second electrode. Preferably the first and second frequencies are different from one another, and even more preferably, the first frequency is greater than the second frequency. The preferred reactor includes a thermocouple which provides temperature information relative to one of the electrodes. According to a preferred implementation, the power loop developed by the first RF power source is grounded interiorly of the chamber in a manner which reduces if not eliminates interference with other reactor components, including the thermocouple.

BRIEF DESCRIPTION OF THE DRAWINGS

Preferred embodiments of the invention are described below with reference to the following accompanying drawings.

FIG. 3 is a flow chart illustrating a preferred processing method used in connection with the FIG. 1 embodiment.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
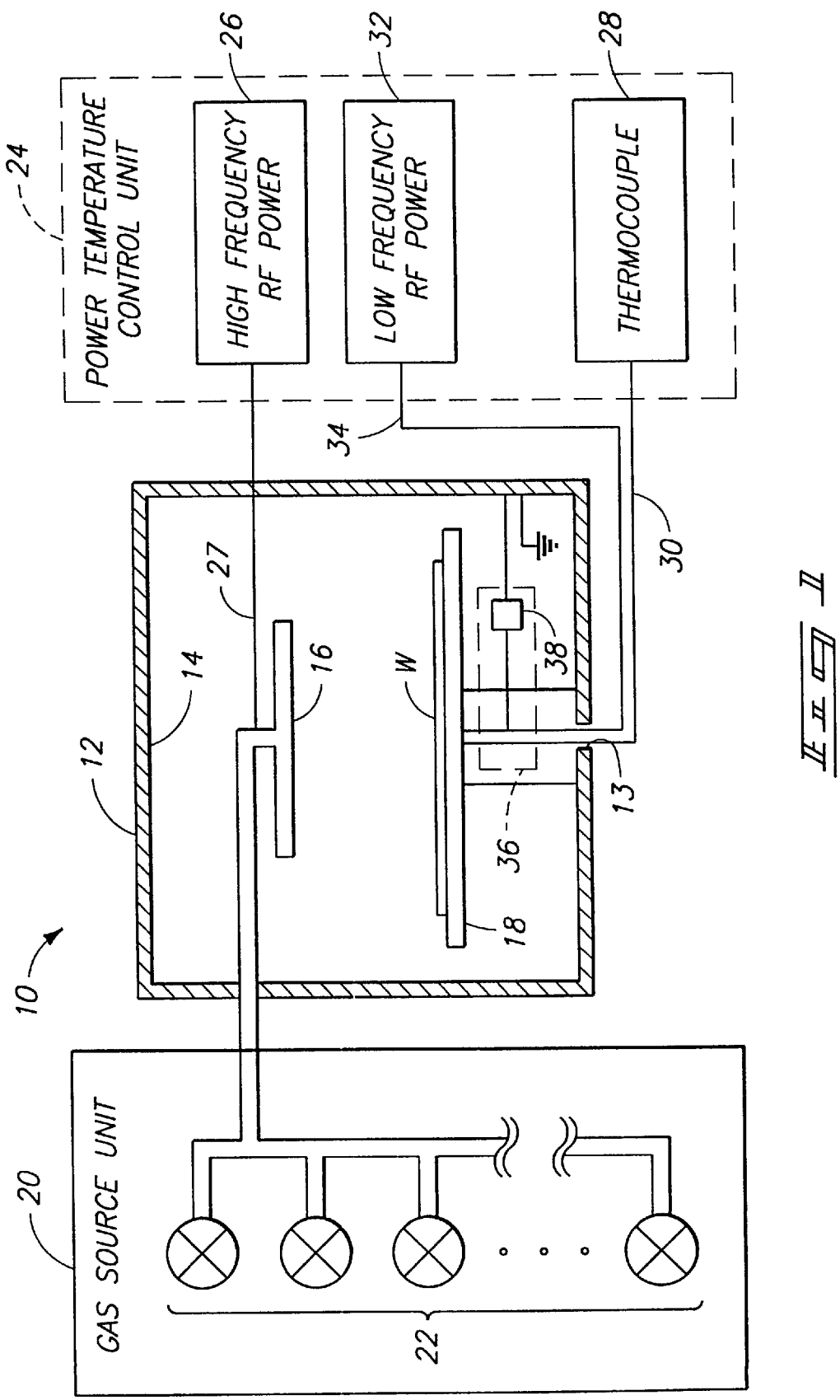
FIG. 1 is a view of a plasma enhanced chemical vapor deposition reactor constructed according to a preferred embodiment of the present invention.

Referring to FIG. 1, a plasma enhanced chemical vapor deposition (PECVD) reactor is shown generally at 10. Reactor 10 includes a reactor chamber 12 having an interior surface 14 which defines a processing chamber in which processing takes place in accordance with the invention. In accordance with a preferred aspect of the invention, at least a portion of interior surface 14 is grounded. Chamber 12 includes a first electrode 16 and a second electrode 18. Preferably, reactor 10 is a parallel plate reactor in which both the first and second electrodes are located or disposed within chamber 12. In the illustrated and preferred embodiment, first electrode 16 comprises a shower head electrode which is configured to provide gaseous reactants into the processing chamber and second electrode 18 is configured for supporting at least one semiconductor workpiece, such as wafer W. The term "supporting" as such is used in this document and in connection with the second electrode is intended to mean holding or positioning one or more semiconductor workpieces in a desired orientation so that chemical vapor deposition can take place. Accordingly, semiconductor workpieces can be supported, held or otherwise positioned in orientations other than the shown horizontal position. Moreover, although the invention is discussed in the context of a system which includes only two electrodes, it is to be understood that the invented reactor and methods can find use in systems which are not necessarily limited to only two electrodes.

A gas source unit 20 is operably connected with reactor 10 and includes a plurality of gas sources 22 for providing gaseous reactants to electrode 16 and into the interior of reactor chamber 12. A power/temperature control unit is shown generally at 24. The components of unit 24 may be separate units or may be contained within a single control unit. Accordingly, such components include a first RF power source 26, a thermocouple or temperature sensor 28, and a second RF power source 32. First RF power source 26 is operably associated with chamber 12 and connected with the first electrode 16 via a first conductive line 27 to deliver RF power of a first frequency thereto. Preferably, the first frequency is a high frequency in the range of between 2–50 MHz. Power source 26 develops, during operation, a first or high frequency power loop a portion of which extends or passes through the reactor chamber and is responsible for developing the plasma environment in which the preferred processing takes place. More specifically, power source 26 develops a high frequency power loop which flows from line 27, through electrode 16, across the gap between electrodes 16 and 18, and through electrode 18. Typically, in the past, the high frequency loop has been grounded through a line which exits an opening, such as opening 13 which is shared with other component connective lines. Although such other lines are typically insulated, the high frequency line has still created undesirable interference and crosstalk conditions.

Thermocouple 28 is operably connected with second electrode 18 via a thermocouple line or temperature sensor line 30 which extends through opening or conduit 13 in reaction chamber 12. The thermocouple or temperature sensor is configured to provide temperature information relative to the second electrode. Such enables the temperature of electrode 18 to be monitored and conventionally controlled by means not shown during semiconductor processing. Opening or conduit 13 defines a path from inside the reactor to outside the reactor.

Power/temperature control unit 24 also includes a second RF power source 32. Such is associated with chamber 12 and operatively connected with second electrode 18 to deliver RF power of a second frequency, which is preferably lower than the frequency delivered by first power source 26. Preferably, the frequency range of power source 32 is 100–1000 kHz. Accordingly, the frequency or frequencies of delivered or developed RF power from first RF power source 26 is (are) characterized as preferably higher than the frequency or frequencies delivered or developed by second or low frequency power source 32. In the illustrated and preferred embodiment, low frequency power source 32 is connected with second electrode 18 by an RF power line, low frequency power line or second conductive line 34 which extends through opening or conduit 13 and connects with second electrode 18.

The above represents a novel departure from conventional reactors and is one which enables PECVD to take place in a manner which can provide deposited films or layers with improved properties over those films or layers which are deposited using conventional reactors. For example, maintaining the electrodes at the preferred power differential facilitates acceleration of ions or ionic species toward the subject workpiece or wafer which enhances conformal coverage, particularly in high aspect ratio topographies. Furthermore, greater uniformity in film or layer composition, as well as greater film or layer purity levels are possible. In a preferred implementation, the first and second electrodes constitute the only electrodes which are capable of being powered.

Referring still to FIG. 1, chamber interior 14 includes a side wall at least a portion of which is grounded as shown. Such desirably enables the high frequency RF power loop which is developed or produced by RF power source 26 to be grounded internally of the chamber. Such reduces interference between the high frequency energy generated thereby and either of the thermocouple connective line 30 or the low frequency power line 34. Alternately and with reference to FIG. 2, a fragmentary portion of reactor chamber 12 is shown. Such alternately enables the high frequency power loop to be grounded externally of the reactor chamber. Accordingly, a grounding path is provided which extends through the reactor side wall to a point externally thereof.

In the FIG. 1 embodiment, a grounding point for the high frequency power loop is provided which is remote from conductive line 34 and thermocouple connective line 30. Preferably the grounding point is inside the reactor chamber and comprises the grounded portion of the chamber interior. According to a preferred aspect of the invention, a grounding path is provided and leads to and defines in part the grounding point. Such is illustrated generally at 36. In the illustrated and preferred embodiment, grounding path 36 includes a portion of the low frequency power line which is disposed on the inside of the chamber. Accordingly, the grounding path grounds or provides a mechanism by which the high frequency power loop can be grounded through the low frequency line from a point taken within the reactor. According to a preferred implementation, grounding path 36 includes a bypass or bandpass filter 38 which is configured to pass only high frequencies, such as those generated or produced by high frequency power source 26. Accordingly, such provides a mechanism by which the high frequency loop can be grounded without affecting the operation of low frequency power source 32 or power produced thereby.

Figure 2:
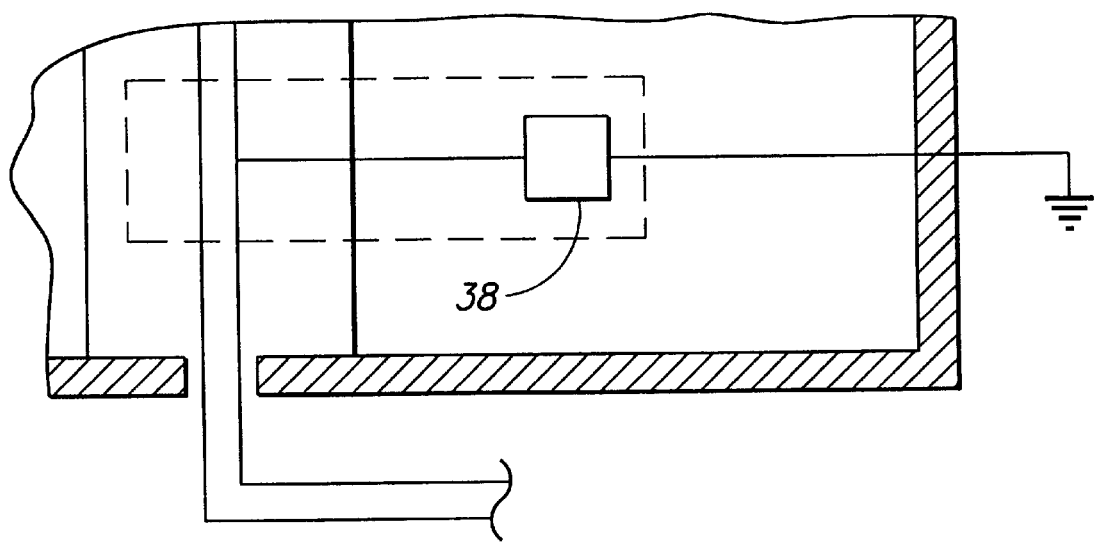
FIG. 2 is a fragmentary portion of the FIG. 1 reactor which illustrates an alternate grounding configuration.

Alternately, as mentioned above, other manners of grounding the high frequency power loop can be utilized. For example, the high frequency power loop may be grounded to an interior portion of the reaction chamber through a suitable grounding wire which is connected directly with the grounded chamber interior portion. By grounding the high frequency RF power loop as just described, undesirable effects associated with interference between the RF frequency developed by power source 26 and the thermocouple line 30 are avoided. Furthermore, the high frequency loop can be grounded at a point or location which is remote from power source 26 and external to the reaction chamber, as shown in FIG. 2. Accordingly, thermocouple 28 provides more accurate temperature information relative to the second electrode or susceptor electrode 18 and crosstalk between the low and high frequency lines is desirably reduced if not eliminated.

In accordance with the preferred parallel plate PECVD reactor, and referring now to FIGS. 1–3, a preferred semiconductor processing method is set forth in a flow diagram indicated generally at 100 in FIG. 3. Accordingly, at step 110 a semiconductor workpiece such as wafer W (FIG. 1) is placed in reactor 10 and preferably upon second or susceptor electrode 18 as shown. The susceptor electrode supports the workpiece interiorly of the preferred reactor for subsequent processing. As pointed out above, other manners of supporting the workpiece or wafer are possible. Gaseous reactants are introduced into the reactor at step 112 preferably through the shower head electrode 16. At step 114, the reactants are exposed to at least two different RF power frequencies to a degree which is sufficient to effect deposition of a reactant product over the semiconductor workpiece. In accordance with a preferred aspect of the invention, RF power of a first frequency is applied to shower head electrode 16 from high frequency RF power source 26. Additionally, a second frequency of RF power is applied to susceptor electrode 18 which supports semiconductor workpiece W. In accordance with a preferred implementation and at step 116, a grounding path is provided which leads to and defines a grounding point for the high frequency power loop developed or produced by first RF power source 26. The grounding point is preferably located at a remote location from other component connective lines. Such may be in the chamber interior, such as on a portion of the chamber interior side wall which is maintained at ground. Alternately, such may be on the chamber exterior or at a point outside of the chamber.

In accordance with a preferred aspect of the invention, the grounding path includes a bypass or bandpass filter 38 which is preferably configured for passing only frequencies of the higher of the two frequencies i.e. those generated or produced by the high frequency power source 26. The filter is advantageously configured for grounding the high frequency power source internally or externally of the reactor which serves to reduce if not eliminate any interference with the thermocouple line 30 and RF power line 34 which extends through a common opening 13.

Among the advantages provided by the above described reactor design and PECVD processing methods are that interference which is generated from the high frequency power loop and which interferes with other of the system's components is reduced if not eliminated by grounding the associated high frequency power loop at a location which is remote from those components. Such provides a PECVD system which is less prone to failure. Additionally and independently of the interference advantage, better film and layer deposition is possible. Such is made possible, in the preferred embodiment, by developing a power or power frequency differential between reactor electrodes with the preferred power or power frequency differential being developed in a parallel plate PECVD reactor by powering the shower head electrode at a high frequency and the susceptor electrode at a low frequency. By doing so, advantages include better film adhesion, lower pinhole density, better step coverage especially in high aspect ratio topographies, and films or layers with better electrical properties. Additionally, in PECVD systems in which etching is performed, better compatibility with fine-line pattern transfer processes can be achieved. Other advantages will be evident to those of skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A plasma enhanced chemical vapor deposition (PECVD) reactor comprising:
   a processing chamber including an interior at least a portion of which is grounded;
   a first electrode within the chamber, the first electrode being a shower head electrode configured to be powered with RF energy having a first frequency;
   a second electrode within the chamber and configured to be powered with RF energy having a second frequency via a power line a portion of which is disposed inside the chamber, the first and second electrodes defining respective plates of a parallel plate PECVD reactor; and
   a grounding path for the first RF frequency inside the chamber comprising only one band pass filter for passing only the first frequency.

2. The plasma enhanced chemical vapor deposition reactor of claim 1, wherein the first frequency is higher than the second frequency.

3. The plasma enhanced chemical vapor deposition reactor of claim 1, wherein:
   the chamber includes a chamber side wall having an opening therein;
   the second electrode is configured to be powered via a power line which extends through the opening in the chamber side wall; and
   the portion is grounded outside the chamber at a point remote from the opening through which the power line extends.

4. The plasma enhanced chemical vapor deposition reactor of claim 1, wherein:
   a first RF power source delivers RF power at the first frequency which is higher than the second frequency; and
   a second RF power source is connected with the second electrode via the power line.

5. The plasma enhanced chemical vapor deposition reactor of claim 1, further comprising:
   a temperature sensor operably connected with the second electrode and configured to provide temperature information relative to the second electrode; and
   a temperature sensor line coupled to the temperature sensor and extending to a point outside of the chamber.

6. A dual frequency plasma enhanced chemical vapor deposition reactor comprising:
   a reactor interior surface defining a processing chamber, at least a portion of the interior surface being grounded;
   a first electrode inside the processing chamber, the first electrode being a shower head electrode configured to be powered by RF energy having a first frequency;
   a second electrode inside the processing chamber and configured to be powered by RF energy of a second frequency; and a grounding path for the first frequency which leads to and operably connects with the grounded portion of the reactor interior surface, the grounding path including only one filter, the filter being configured to pass only the first frequency.

7. The dual frequency plasma enhanced chemical vapor deposition reactor of claim 6, wherein the second electrode is configured for supporting at least one semiconductor workpiece for processing internally of the chamber.

8. The dual frequency plasma enhanced chemical vapor deposition reactor of claim 6, wherein the first electrode is configured for providing reactants into the chamber for processing.

9. The dual frequency plasma enhanced chemical vapor deposition reactor of claim 6 wherein the grounding path comprises a bandpass filter which is configured for passing the first frequency.

10. The dual frequency plasma enhanced chemical vapor deposition reactor of claim 6 further comprising a power line coupling the second frequency to the second electrode, a portion of the power line defining at least a portion of the grounding path.

11. The dual frequency plasma enhanced chemical vapor deposition reactor of claim 6 further comprising a power line connecting the second frequency to the second electrode, a portion of the second frequency power line defining at least a portion of the grounding path, the grounding path further comprising a bandpass filter configured for passing the first frequency.

12. The dual frequency plasma enhanced chemical vapor deposition reactor of claim 6 further comprising:
a conduit defining a path from inside the reactor to outside the reactor;
a power line extending through the conduit and operably connecting the second electrode to the second frequency;
a temperature sensor operably connected with the second electrode and configured to provide temperature information relative to the second electrode; and
a temperature sensor line connected with the temperature sensor and extending through the conduit to a point outside the reactor.

13. The dual frequency plasma enhanced chemical vapor deposition reactor of claim 6, further comprising:
a temperature sensor operably connected with the second electrode and configured to provide temperature information relative to the second electrode; and
a temperature sensor line coupled to the temperature sensor and extending to a point outside of the reactor.

14. The dual frequency parallel plate plasma enhanced chemical vapor deposition reactor of claim 6, wherein the second frequency is lower than the first frequency.

15. A plasma reactor comprising:
a reactor chamber;
a first electrode inside the chamber, the first electrode being a shower head electrode configured to be powered by RF energy having a first frequency;
a second electrode inside the chamber, the second electrode being configured to be powered by RF energy having a second frequency; and
a grounding path between the grounding point and the first RF power source, the grounding path including only one filter, the only one filter being configured to pass only the first frequency.

16. The plasma reactor of claim 15, further comprising a grounding point inside the reactor chamber.

17. The plasma reactor of claim 15, further comprising a grounding point outside the reactor chamber.

18. The plasma reactor of claim 15, further comprising a grounding point inside the reactor chamber, the location of the grounding point being defined in part by a grounding path which leads thereto.

19. The plasma reactor of claim 15, further comprising a grounding path inside the chamber leading to a grounding point, a portion of the grounding path being defined by a portion of conductive line coupling the second frequency to the second electrode.

20. The plasma reactor of claim 15, further comprising a grounding point inside the reactor chamber, the location of the grounding point being defined in part by a grounding path which leads thereto, and wherein the grounding path includes a filter configured to pass only the first frequency.

21. The plasma reactor of claim 15, wherein the first frequency is higher than the second frequency.

22. The plasma reactor of claim 15, wherein a grounding point is inside the reactor chamber and the first frequency is higher than the second frequency.

23. The plasma reactor of claim 15, further comprising:
a temperature sensor operably connected with the second electrode and configured to provide temperature information relative to the second electrode; and
a temperature sensor line coupled to the temperature sensor and extending to a point outside of the chamber.

24. A method of effecting plasma enhanced chemical vapor deposition in a parallel plate reactor comprising:
applying RF power of a first frequency to a shower head electrode internally of the reactor;
applying RF power of a second frequency to a susceptor electrode internally of the reactor; and
grounding to an interior reactor surface using a single filter, an RF power loop of only the first frequency.

25. The method of claim 24, wherein the reactor includes an interior side wall portion which is grounded, and the grounding comprises providing a grounding path for the RF power loop which connects with the grounded interior side wall portion.

26. The method of claim 24, wherein the first frequency is higher than the second frequency.

27. The method of claim 24, wherein the second frequency is connected to the susceptor electrode by a conductive line, and grounding the RF power loop inside the reactor at a grounding point which is remote from the conductive line.

28. The method of claim 24, wherein:
the reactor includes an interior side wall portion which is grounded, and the grounding comprises providing a grounding path for the first frequency which connects with the grounded interior side wall portion; and
the grounding path includes a bandpass filter which is configured to pass only frequencies of the first frequency.

29. The method of claim 24 further comprising:
operatively connecting a thermocouple with the susceptor electrode via a thermocouple line which extends through an opening in a reactor side wall;
connecting the second frequency to the susceptor electrode by a conductive line which extends through the opening in the reactor sidewall; and
wherein grounding comprises grounding the power loop inside the reactor at a grounding point remote from the opening.

30. The method of claim 24, further comprising operatively coupling a thermocouple to the susceptor electrode.

31. A method for plasma enhanced chemical vapor deposition comprising:

supporting with a susceptor electrode at least one semiconductor workpiece inside a parallel plate plasma enhanced chemical vapor deposition reactor; and exposing reactants to at least two different RF power frequencies to a degree sufficient to effect deposition of a reactant product over the semiconductor workpiece, the exposing step comprising:

grounding to a reactor interior surface, an RF power loop of only one of the RF power frequencies using a grounding path including a single filter configured to pass only frequencies of the power loop.

32. The method of claim 31, wherein grounding comprises grounding the RF power loop of a higher of the two RF frequencies.

33. The method of claim 31, wherein the grounding comprises providing a grounding path which includes a bandpass filter configured to pass only a lower of the two RF frequencies.

34. The method of claim 31 wherein:

the two different RF power frequencies are produced by two different RF power sources, a first of the RF power sources developing RF power at frequencies higher than those of RF power developed by a second of the RF power sources, the first RF power source being coupled with the shower head electrode, and the second of the power sources being coupled with the susceptor electrode;

the RF power loop which is grounded corresponds to the higher of the two frequencies; and the grounding comprises grounding the RF power loop of the higher of the two frequencies.

35. The method of claim 31, further comprising operatively coupling a thermocouple to the susceptor electrode.

* * * * *